(12) United States Patent
Okuno

(10) Patent No.: US 10,411,048 B2
(45) Date of Patent: Sep. 10, 2019

(54) CONTROL APPARATUS, IMAGE PICKUP APPARATUS, AND IMAGE PICKUP CONTROL METHOD

(71) Applicant: CANON KABUSHIKI KAISHA, Tokyo (JP)

(72) Inventor: Takeharu Okuno, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 15/631,588

(22) Filed: Jun. 23, 2017

(65) Prior Publication Data

US 2018/0006066 A1 Jan. 4, 2018

(30) Foreign Application Priority Data

Jul. 1, 2016 (JP) ................................ 2016-131638

(51) Int. Cl.
*H01L 27/14* (2006.01)
*H01L 27/146* (2006.01)

(52) U.S. Cl.
CPC ........ *H01L 27/14* (2013.01); *H01L 27/14605* (2013.01); *H01L 27/14621* (2013.01); *H01L 27/14627* (2013.01); *H01L 27/14629* (2013.01)

(58) Field of Classification Search
CPC .................... H01L 27/14; H01L 27/14605
See application file for complete search history.

(56) References Cited

U.S. PATENT DOCUMENTS

| 8,164,673 | B2 | 4/2012 | Horie | |
|---|---|---|---|---|
| 9,489,728 | B2 | 11/2016 | Imagawa | |
| 2009/0244355 | A1* | 10/2009 | Horie | G02B 5/22 348/340 |
| 2015/0235375 | A1* | 8/2015 | Imagawa | G06T 5/50 382/164 |

FOREIGN PATENT DOCUMENTS

| JP | 2009258618 A | 11/2009 |
|---|---|---|
| JP | 2011135360 A | 7/2011 |
| JP | 5682437 B2 | 3/2015 |
| JP | 2015172926 A | 10/2015 |

* cited by examiner

*Primary Examiner* — Christopher K Peterson
(74) *Attorney, Agent, or Firm* — Rossi, Kimms & McDowell LLP

(57) ABSTRACT

A control apparatus includes a controller configured to instruct an image pickup apparatus that includes an image pickup element configured to capture an image formed by an optical system to capture a plurality of images in different polarization directions, and to obtain polarization information based on the plurality of images. The controller instructs the image pickup apparatus to capture the plurality of images on exposure conditions different from one another while setting constant an F-number of the optical system.

12 Claims, 8 Drawing Sheets

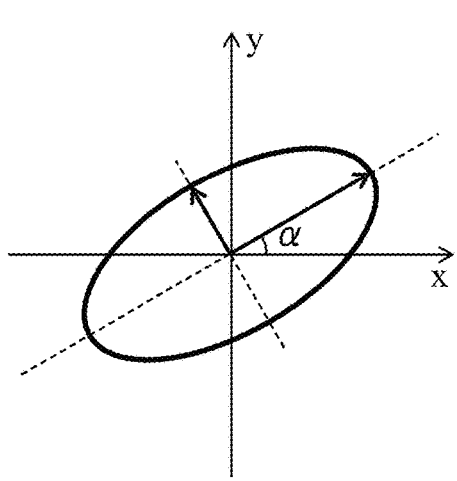
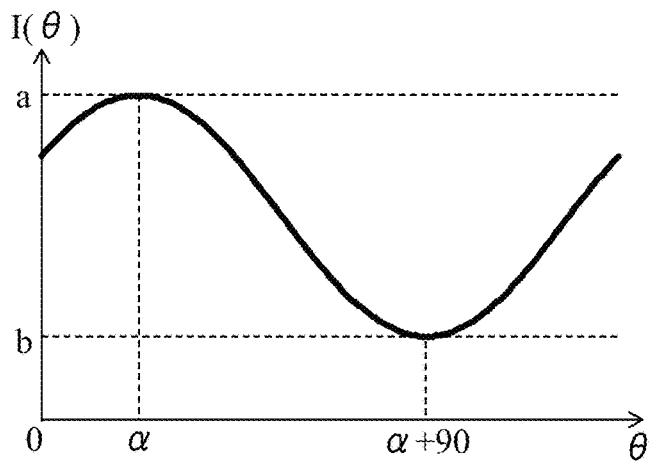
FIG. 5A
FIG. 5B
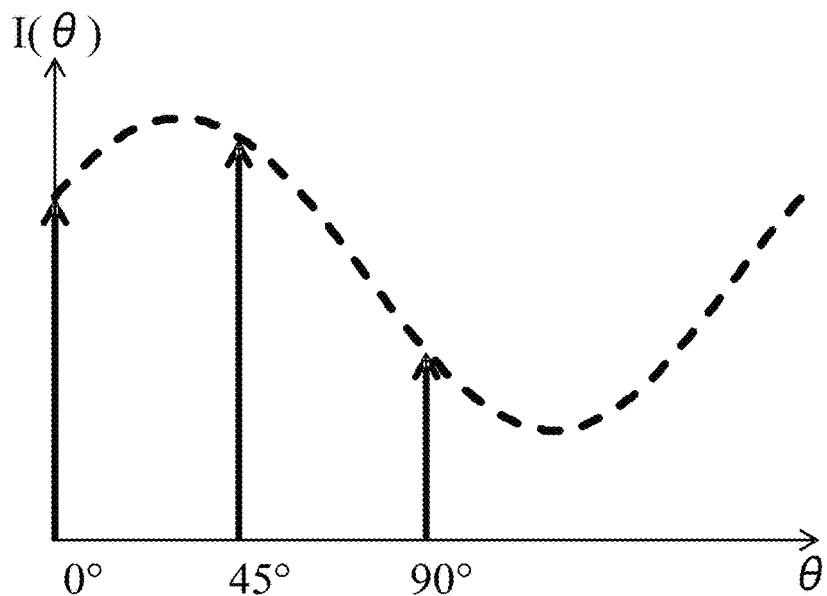
FIG. 6

CONTROL APPARATUS, IMAGE PICKUP APPARATUS, AND IMAGE PICKUP CONTROL METHOD

BACKGROUND OF THE INVENTION

Field of the Invention

The present invention relates to a control apparatus, an image pickup apparatus, and an image pickup control method.

Description of the Related Art

One conventional image pickup apparatus selectively obtains polarized light in a specific azimuth and acquires an image with an emphasized predetermined feature of an object. For example, a polarization filter attached to a front surface of a lens in a single-lens reflex camera and a proper selection of a polarization direction in capturing an image can emphasize the quality (or feel) of the object, such as a color and a contrast, or provide a variety of effects, such as an emphasis or reduction of the glare of reflected light on a water surface. Moreover, this design can detect an outline, shape or defective part in a test object by using processed images in a plurality of polarization directions, and thus is applicable to a new application, such as an inspection and surveillance, different from a usual image pickup.

Japanese Patent No. 5,682,437 discloses an image pickup apparatus that images polarized light from an object and a target, includes a wire grid polarizer that transmits polarized light different for each pixel on a solid-state image pickup element, and extracts polarization information from a plurality of pixels. Japanese Patent Laid-Open No. 2015-172926 discloses an image processing method for obtaining an image with a high SN ratio or a suppressed specular reflection under a dark environment. This method obtains a normal image and a polarized image, and generates a combined image based on a differential value between the normal image and the polarized image.

However, the image pickup apparatus disclosed in Japanese Patent No. 5,682,437 uses the plurality of pixels to obtain polarization information, and thus sacrifices the resolution or chromatic information. In addition, the image pickup apparatus disclosed in Japanese Patent No. 5,682,437 captures an image with a high polarization degree, such as a landscape in which light is reflected on a water surface due to backlight, an exposure amount scatters for each pixel and sufficient quality cannot be secured due to the overexposure (clipped whites) and underexposure (black crashes) in the generated image.

In Japanese Patent Laid-Open No. 2015-172926, an obtained polarized image is dark. Where a range of a pixel value (a value relating to the brightness of the pixel) is different between the normal image and the polarized image, this method generates a combined image by normalizing pixel values of these images. However, where the polarized image contains many underexposures or noises due to its small light quantity, the image cannot at all be generated even when the pixel values are normalized or an image with a high SN ratio cannot be obtained.

SUMMARY OF THE INVENTION

The present invention provides a control apparatus, an image pickup apparatus, and an image pickup control method, which can obtain good polarization information.

A control apparatus according to one aspect of the present invention includes a controller configured to instruct an image pickup apparatus that includes an image pickup element configured to capture an image formed by an optical system to capture a plurality of images in different polarization directions, and to obtain polarization information based on the plurality of images. The controller instructs the image pickup apparatus to capture the plurality of images on exposure conditions different from one another while setting constant an F-number of the optical system.

Further features of the present invention will become apparent from the following description of exemplary embodiments with reference to the attached drawings.

BRIEF DESCRIPTION OF THE DRAWINGS

FIGS. 5A and 5B illustrate a relationship between an azimuth angle and a luminance value.

FIG. 6 illustrates an illustrative measurement.

DESCRIPTION OF THE EMBODIMENTS

Figure 1A:
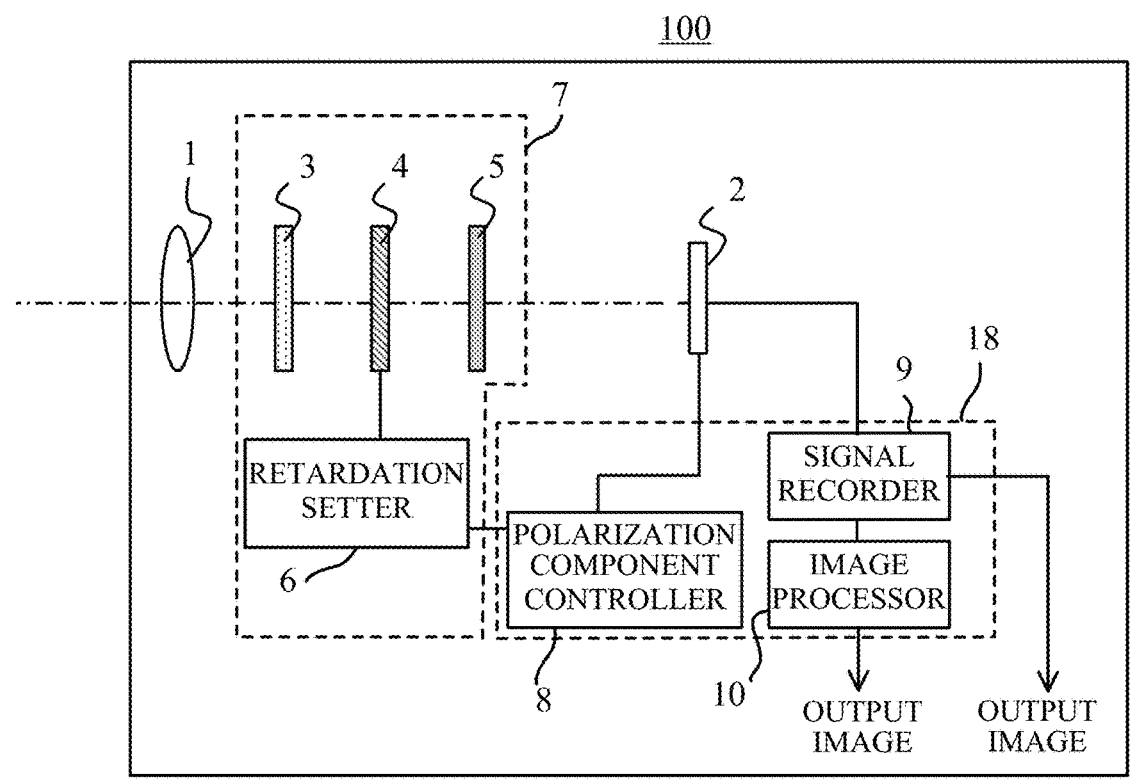
FIGS. 1A to 1C illustrate a configuration of an image pickup apparatus according to this embodiment of the present invention.

A detailed description will now be given of embodiments of the present invention with reference to the accompanying drawings. Those elements in each figure, which are corresponding elements, will be designated by the same reference numerals, and a description thereof will be omitted.

Referring to FIG. 1, a description will be given of a configuration of an image pickup apparatus 100 according to an embodiment of the present invention. FIG. 1A is a schematic view that simply illustrates the configuration of the image pickup apparatus 100. The image pickup apparatus 100 includes an optical system 1 configured to image light from an object on an image pickup element 2, the image pickup element 2 configured to obtain image information of the object, a polarization obtainer 7 disposed on an optical path between the optical system 1 and the image pickup element 2, and a control apparatus (controller) 18 as a microcomputer, etc. The optical system 1 includes an (unillustrated) aperture stop configured to control an F-number of a lens. This embodiment disposes the polarization controller 7 on the optical path between the optical system 1 and the image pickup element 2, but the present invention is not limited to this embodiment. The polarization obtainer 7 may be disposed on a light incident side (object side) of the image pickup element 2, but may be disposed on the light incident side of the optical system 1 or among the plurality of optical elements where the optical system 1 includes a plurality of optical elements.

Figures 1B, 1C:
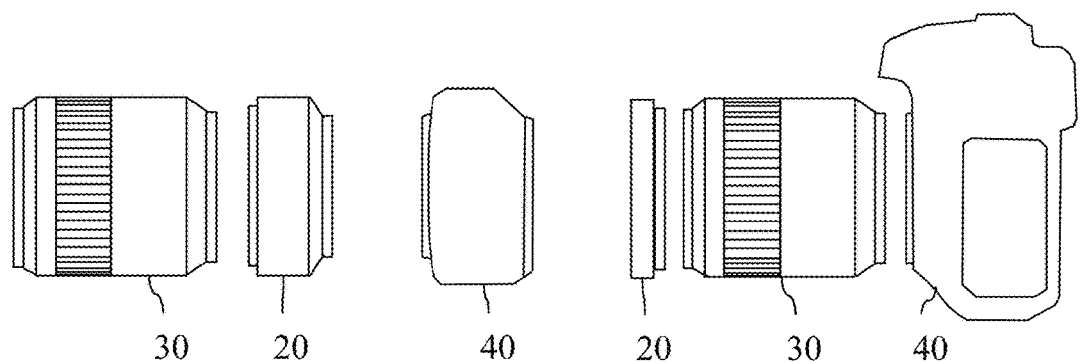

The polarization obtainer 7 is provided in the image pickup apparatus 100 in this embodiment, may be configured as an adapter 20 (an optical apparatus) separate from the image capturing apparatus 100, as illustrated in FIGS. 1B and 1C. The adapter 20 can be attached to the lens or digital camera having a common mount, and used in combination with an optical system (lens) 30 and a camera body 40 at a position illustrated in FIGS. 1B and 1C in obtaining polarization information. These components may communicate information with each other through electronic contacts in the mounts or a radio communication unit, such as WiFi or Bluetooth®.

The polarization obtainer 7 includes a quarter waveplate (first retardation plate) 3, a variable retardation plate (second retardation plate) 4, a polarizer 5, and a retardation setter 6. The quarter waveplate 3, the variable retardation plate 4, and the retardation plate 5 are arranged so that each axis is located on a plane perpendicular to the optical axis in the optical system 1. The quarter waveplate 3 includes an extension film, and provides a (relative) retardation (phase difference) of π/2 (rad) between polarization components orthogonal to the incident light. The retardation of n/2 provided by the quarter waveplate 3 is unchangeable or fixed. This embodiment uses the quarter plate, but a third-quarter plate or a variable retardation plate may be used as long as it can provide a retardation of n/2. The variable retardation plate 4 is a device using liquid crystal, and provides a (relative) retardation similar to that of the quarter waveplate 3 (referred to as a "retardation of the variable retardation plate 4" hereinafter) between the polarization components orthogonal to the incident light which is variable according to the applied voltage. The polarizer 5 transmits (extracts) a component of the transmitting axis direction (transmitting polarization direction) among the polarization components of the incident light. When the polarizer 5 is a type of reflecting the unnecessary light, such as a wire grid polarizer, it reflects the polarized light to be cut and the reflected light becomes stray light and ghost, negatively affecting the image. Thus, the polarizer 5 may use a type of absorbing the unnecessary light. In order to reduce the influence of the ghost, the polarizer 5 may characteristically absorb 50% or more of the polarized light that oscillates in the direction orthogonal to the transmission axis. This polarizer may include, for example, a film made by extending a resin material containing an iodic compound, but the present invention is not limited to this example and may use an arbitrary absorption type polarizer. A working wavelength range is a wavelength range in which the image pickup apparatus 100 works, and can be selected based on the wavelength characteristic of the image pickup element 2 and application. This embodiment sets the working wavelength range to a visible range (400 nm to 700 nm). The working wavelength range may be at least one of the visible range (400 nm to 700 nm), the near-infrared range (700 nm to 1100 nm), and the near-ultraviolet range (200 nm to 400 nm) based on the configuration of the image pickup apparatus 100. A designed wavelength λ (nm) for the variable retardation plate 4 may be selected according to the working wavelength range obtained by the image pickup apparatus 100 so as to maintain the proper characteristic. The retardation setter 6 sets (changes) the retardation of the variable retardation plate 4 according to the signal (command) from the image pickup apparatus 100. This embodiment provides the retardation setter 6 in the polarization obtainer 7, but may provide it into the image pickup apparatus 100 separate from the polarization obtainer 7.

The configuration of the polarization obtainer 7 is not limited as long as the transmitting axis direction is controllable. For example, a polarizer that transmits linearly polarized light may be used. In this case, the transmitting axis direction can be controlled by rotating the polarizer on a plane perpendicular to the optical axis of the optical system 1.

The control unit (control apparatus) 18 includes a polarization component controller 8, a signal recorder 9, an image processor 10, and controls the image pickup by the image pickup apparatus 100. The image pickup apparatus captures an image by timewise changing the retardation of the variable retardation plate 4 while maintaining the transmitting axis direction of the polarizer 5. The control unit 18 obtains polarization information of the object based on a plurality of obtained images. The polarization component controller 8 outputs a control signal for the retardation of the variable retardation plate 4 to the retardation setter 6 in synchronization with the image pickup element 2. This control changes the polarization component of light from the object which the image pickup element 2 receives, and can provide an image having the polarization information of the object. The signal recorder 9 temporarily stores an image acquired from the image pickup element 2 etc. in an unillustrated recording medium, such as a RAM. The stored images may be output as a plurality of images directly or as one or more images after the image processor 10 performs a predetermined process. The plurality of directly output images may be later processed by an external processing apparatus, such as a PC, as an image to which a more complicated calculation is provided. Where the signal processor 10 extracts a predetermined feature amount, a predetermined image can be quickly obtained.

The control unit 18 in this embodiment is provided in an image pickup apparatus, such as a camera body of a lens interchangeable camera, a lens integrated camera, and a camera mounted onto a cellular phone and a smartphone, and controls the image pickup by the image pickup apparatus, but the present invention is not limited to this embodiment. For example, the control unit 18 may control the image pickup by a remote-controlled image pickup apparatus, such as a surveillance camera and a fixed point observation camera.

Referring now to FIGS. 2A to 2D, a description will be given of a behavior of incident light on the polarization obtainer 7 where a transmitting axis direction of the polarizer 5 is fixed and the retardation of the variable retardation plate 4 is set constant. FIGS. 2A to 2D illustrate transmittance dependencies of the polarization obtainer 7 on the polarization direction of the incident light. In FIG. 2, the retardation of the variable retardation plate 4 is set to λ/4. An arrow direction and length before and after the transmission through the polarization obtainer 7 represent the polarization direction and intensity. Each broken-line arrow on the quarter waveplate 3 and the variable retardation plate 4 represents a slow axis direction, and a broken-line arrow on the polarizer 5 represents a transmitting axis direction. In this embodiment, the polarization direction is an amplitude direction of an electric field (or magnetic field) in the linearly polarized light.

The quarter waveplate 3 and the polarizer 5 are arranged so that the slow axis direction of the quarter waveplate 3 is parallel to the transmitting axis direction of the polarizer 5. However, they may not be strictly parallel to each other and may be substantially (approximately) parallel to each other so as to permit a slight angular shift by several degrees. The variable retardation plate 4 is disposed so that its slow axis direction inclines to the slow axis direction of the quarter waveplate 3 and the transmitting axis direction of the polarizer 5 by 45 degrees. However, it may not be strictly 45 degrees and considered to be substantially 45 degrees (almost 45 degrees) so as to permit a slight angular shift by several degrees.

In this embodiment, each of the slow axis direction of the quarter wavelength 3 and the transmitting axis direction of the polarizer 5 relative to the x-axis direction forms an azimuth angle φ of 90 degrees. However, it may not be strictly 90 degrees and considered substantially or almost 90 degrees so as to permit a slight angular shift by several degrees. The azimuth angle φ of the slow axis direction of the variable retardation plate 4 relative to the x-axis is 45 degrees. However, it may not be strictly 45 degrees and considered to be substantially 45 degrees (almost 45 degrees) so as to permit a slight angular shift by several degrees.

The quarter waveplate 3 and the polarizer 5 may be arranged so that each of the slow axis direction of the quarter waveplate 3 and the transmitting axis direction of the polarizer 5 are parallel to the y-axis direction. In this case, the azimuth angle φ of the fast axis direction of the variable retardation plate 4 relative to the x-axis direction is 45 degrees.

Figures 2A, 2B, 2C, 2D:
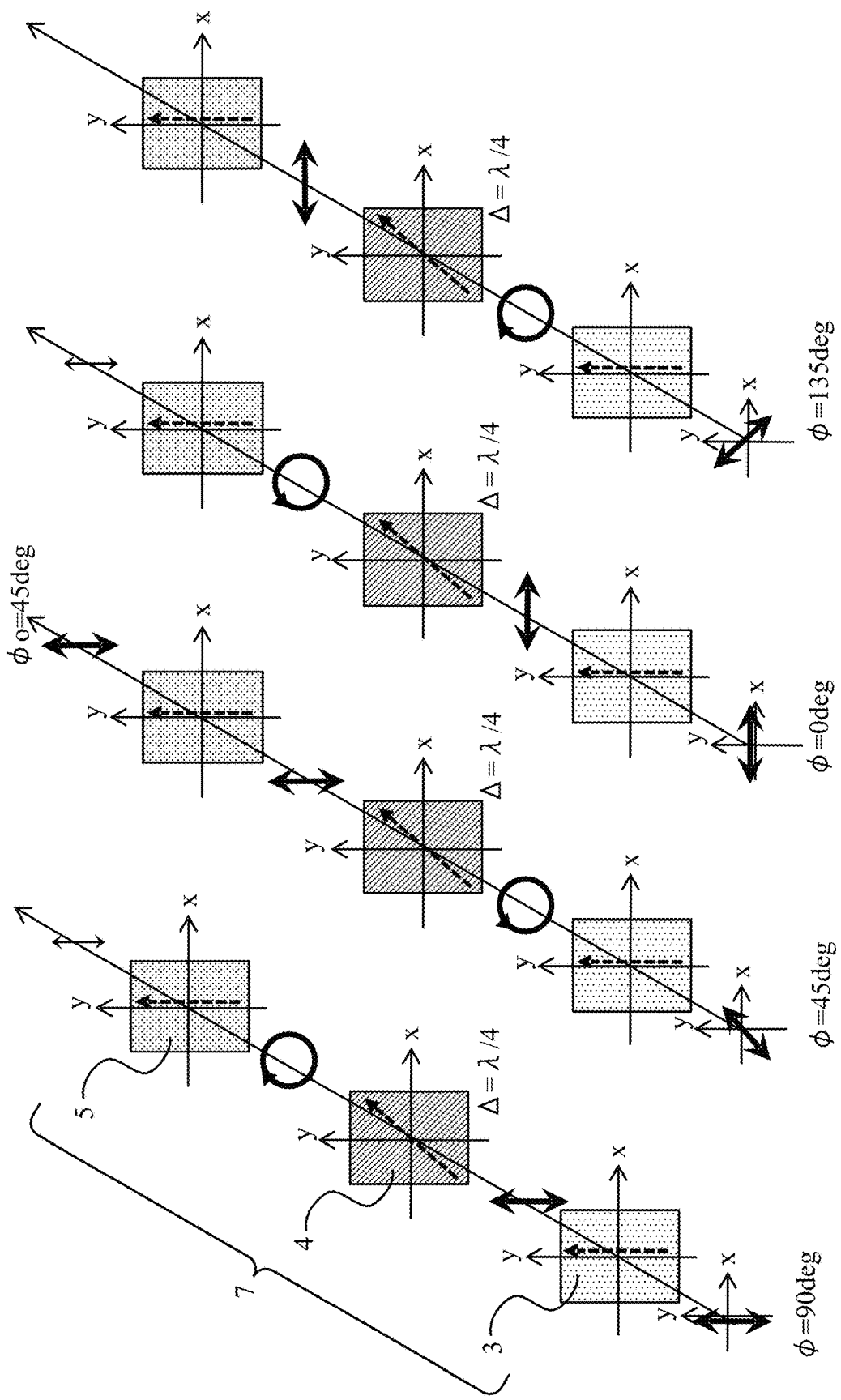
FIGS. 2A to 2D illustrate transmittance dependencies of a polarization obtainer on a polarization direction of incident light.

FIG. 2A illustrates an incident polarization component with an azimuth angle φ of 90°. The incident light transmits through the quarter waveplate 3 without being affected by the phase change, since the polarization direction is parallel to the slow axis direction of the quarter waveplate 3. The light that has transmitted through the quarter waveplate 3 is converted into rightward circularly polarized light by the variable retardation plate 4, and becomes linearly polarized light having an intensity of about 50% of the incident light after transmitting through the polarizer 5.

FIG. 2B illustrates an incident polarization component with an azimuth angle φ of 45 degrees. The incident light is converted into leftward circularly polarized light by the quarter waveplate 3. The light that has transmitted through the quarter waveplate 3 is converted into linearly polarized light having an azimuth angle φ of 90 degrees in the polarization direction by the variable retardation plate 4 and parallel to the transmitting axis direction of the polarizer 5. Thus, the resultant light transmits through the polarizer 5 with few losses.

FIG. 2C illustrates an incident polarization component with an azimuth angle φ of 0 degrees. The incident light transmits through the quarter waveplate 3 without being affected by the phase change, since the polarization direction is orthogonal to the slow axis direction of the quarter waveplate 3. The light that has transmitted through the quarter waveplate 3 is converted into leftward circularly polarized light by the variable retardation plate 4, and becomes linearly polarized light having an intensity of about 50% of the incident light after transmitting through the polarizer 5.

FIG. 2D illustrates an incident polarization component with an azimuth angle φ of 135 degrees. The incident light is converted into rightward circularly polarized light by the quarter waveplate 3. The light that has transmitted the quarter waveplate 3 is converted into linearly polarized light having an azimuth angle φ of 0 degrees in the polarization direction by the variable retardation plate 4 and orthogonal to the transmitting axis direction of the polarizer 5. Thus, the resultant light rarely transmits through the polarizer 5.

When the retardation of the variable retardation plate 4 is λ/4, the transmittance of the polarization component with the azimuth angle φ of 45 degrees becomes maximum in the polarization component of the incident light on the polarization obtainer 7. Hereinafter, φ$_o$ (degree) is an angle (maximum transmission angle) of the polarization component relative to the x-axis direction, which provides the maximum transmittance in the polarization component of the incident light on the polarization obtainer 7.

Figure 3:
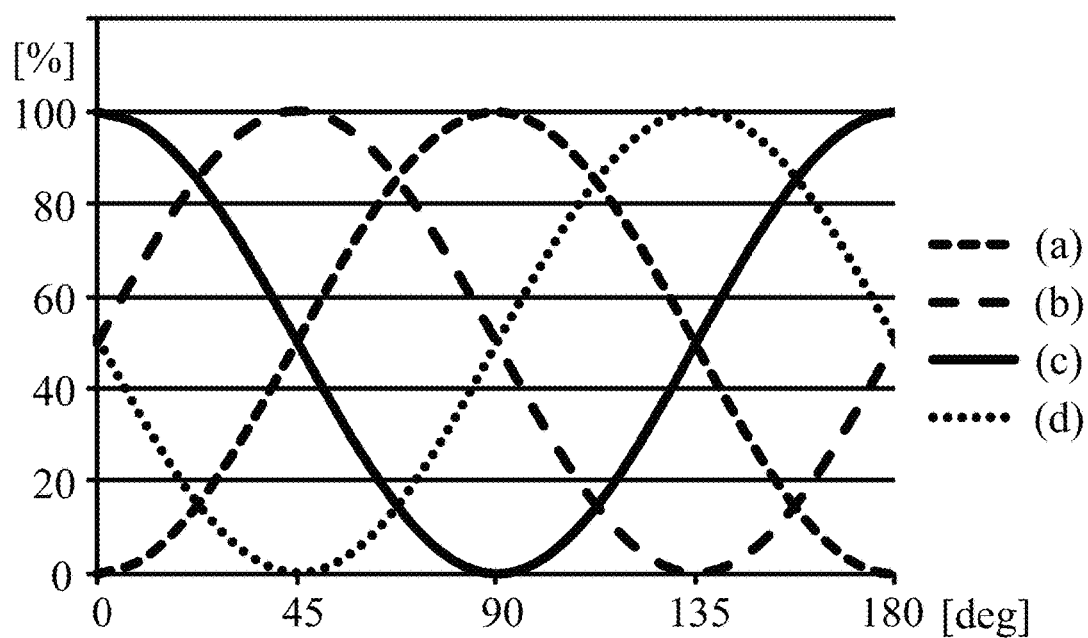
FIG. 3 illustrates a transmittance dependency of a polarization modulator on a polarization component of incident light for each retardation of variable retardation plate.

FIG. 3 illustrates a relationship between the azimuth angle φ of the polarization component of the incident light and the transmittance T(φ) of the polarization obtainer 7 for each retardation of the variable retardation plate 4. Lines (a) to (d) in FIG. 3 represent the retardations of 0, λ/4, λ/2, and 3λ/4 set to the variable retardation plate 4. For example, in the line (a), the transmittance T(φ) is 100% when the azimuth angle φ is 90 degrees, and the maximum transmission angle φ$_o$ is 90 degrees. Similarly, in the lines (b), (c), and (d), the maximum transmission angles φ$_o$ are 45 degrees, 0 degrees, and 135 degrees (−45 degrees). As discussed, the maximum transmission angle φ$_o$ and the retardation Δψ (degree) of the variable retardation plate 4 are expressed as follows:

$$\varphi_0 = 90 - \Delta\psi/2 \quad (1)$$

The transmitting polarization direction can be controlled by controlling the retardation of the variable retardation plate 4 based on the expression (1).

Figure 4:
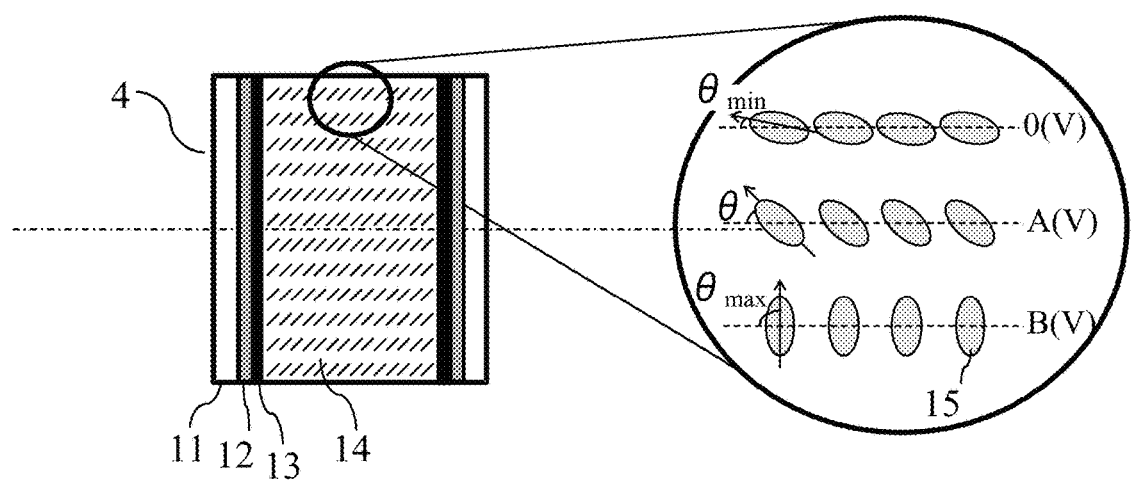
FIG. 4 is a configuration diagram of the variable retardation plate.

Referring now to FIG. 4, a description will be given of a configuration of the variable retardation plate 4. FIG. 4 is a configuration diagram of the variable retardation plate 4, and a circle in FIG. 4 enlarges the liquid crystal layer. The variable retardation plate 4 includes substrates 11, electrode layers 12, alignment films 13, and a liquid crystal layer 14 held by the substrates 11, the electrode layers 12, and the alignment films 13. The liquid crystal layer 14 is a VA type liquid crystal layer (VA liquid crystal layer), and liquid crystal molecules 15 follow the alignment film 13. When the applied voltage is changed in order of 0 [V], A [V], and B (>A) [V], the tilt angle of the liquid crystal molecule 15 changes from a minimum value θ$_{min}$ (degree) to a maximum value θ$_{max}$ (degree) through an intermediate value θ (degree). The retardation setter 6 applies the voltage to the variable retardation plate 4, controls the tilt angle θ of the liquid crystal molecule 15 or the refractive index anisotropy, and changes the retardation of the variable retardation plate 4.

Assume that a maximum retardation Δ$_{max}$ (degree) is a retardation when the tilt angle has a maximum value θ$_{max}$ (degree) and a minimum retardation Δ$_{min}$ (degree) is a retardation when the tilt angle has a minimum value θ$_{min}$ (degree). Then, the phase change amount is expressed by a difference between the maximum retardation Δ$_{max}$ and the minimum retardation Δ$_{min}$. The retardation of the variable retardation plate 4 is variable in a range equal to or larger than the minimum retardation Δ$_{min}$ and equal to or smaller than the maximum retardation Δ$_{max}$ according to the applied voltage, but may include at least one of the maximum retardation and the minimum retardation. The retardation of the variable retardation plate 4 may include both of the maximum retardation and the minimum retardation. This is because the driving control characteristic when the retardation of the variable retardation plate 4 is set to the maximum retardation Δ$_{max}$ or the minimum retardation Δ$_{min}$ is superior to that when the retardation of the variable retardation plate 4 is set to a retardation of an intermediate value (intermediate retardation). In addition, this is because a retardation change caused by an incident angle when the retardation of the variable retardation plate 4 is set to the maximum retardation $\Delta_{max}$ or the minimum retardation $\Delta_{min}$ is less than that when the retardation of the variable retardation plate 4 is set to a retardation of an intermediate value. This embodiment may use, but is not limited to, the VA liquid crystal. For example, the present invention can use a variety liquid crystals, such as the TN liquid crystal and the OCB liquid crystal.

Next follows a description of a principle of acquiring polarization information according to this embodiment. By one example, a description will be given when the polarization information is obtained by using reflected light from an object illustrated in FIGS. 5A and 5B. An ellipse illustrated in FIG. 5A indicates an azimuth dependency of an amplitude at an illustrative polarization state. In FIG. 5A, broken lines represent a long axis and a short axis of the ellipse, and arrows represent a long axis radius and a short axis radius. FIG. 5B illustrates a luminance value (light intensity) $I(\theta)$ of the polarized light relative to the azimuth angle $\theta$ from the x-axis. Assume that "a" is a maximum luminance value and "b" is a minimum luminance value in the luminance value $I(\theta)$, and $\alpha$ (degree) is an azimuth angle (maximum azimuth angle) corresponding to the maximum luminance value "a" relative to the x-axis. Then, the luminance value $I(\theta)$ to the azimuth angle $\theta$ is expressed as follows.

$$I(\theta)=(a-b)\cdot\cos^2(\theta-\alpha)+b \quad (2)$$

Since the luminance value $I(\theta)$ changes every 180 degrees, luminance values for three azimuth angles $\theta$ are measured from 0 degrees inclusive to 180 degrees or three images are obtained and thereby the polarization information (maximum luminance value a, minimum luminance value b, and maximum azimuth angle $\alpha$) for each pixel can be calculated. For example, as illustrated in FIG. 6, the polarization information for each pixel is calculated and a change of the luminance value $I(\theta)$ for the azimuth angle $\theta$ can be found by measuring the luminance values $I(0)$, $I(45)$, and $I(90)$ for one predetermined pixel in images with the azimuth angles $\theta$ of 0 degrees, 45 degrees, and 90 degrees. Thus, it is unnecessary to adjust the obtained polarization direction while the image to be captured is being observed, the image can be mechanically captured in the preset polarization state. As a result, the image can be quickly captured.

This embodiment obtains the polarization information based on the luminance values of three images, but the present invention is not limited to this embodiment. For example, the present invention may obtain polarization information by fitting luminance values of four or more images or by capturing two images with the maximum luminance value and the minimum luminance value.

An image with a feel different from that of the obtained image can be generated by utilizing the obtained polarization information. Herein, the "feel" is reflected light from the object. A description will now be given of a relationship between polarization information and reflected light. The reflected light from the object is classified into a specular reflection component directly reflected from the surface of the object, and a diffuse reflection component scattered and reflected in the inside or surface. The specular reflection component is reflected on the condition of the Fresnel reflection. In the Fresnel reflection, the intensity of the s-polarized light is higher than that of the p-polarized light except for part of the condition. Thus, the polarized light intensity in the specular reflection component changes according to the azimuth or the specular reflection component has an azimuth dependency. On the other hand, the diffuse reflection component is derived from light that enters the object, is a component reflected in a variety of directions, and has few azimuth dependencies. Thus, in the obtained polarization information, a component (a-b) having an intensity that changes according to the azimuth angle $\theta$ is regarded as a specular reflection component and a component "b" having a fixed intensity is regarded as a diffuse reflection component. Then, the image can be generated by calculating the specular reflection component and the diffuse reflection component according to the purpose. Thereby, an image that has a state of reflected light (or feel) different from that of the obtained image can be generated without utilizing dedicated illumination light, etc.

Next follows a description of a method of obtaining polarization information by utilizing the reflected light from an object that causes an extreme luminance difference between polarization directions. The extreme luminance difference between polarization directions occurs when light enters, at a high angle, an object that is likely to cause a specular reflection, for example, when the morning sun or evening sun is reflected on a sea surface or pool or when streetlight is reflected on a display window etc.

Figure 7A:
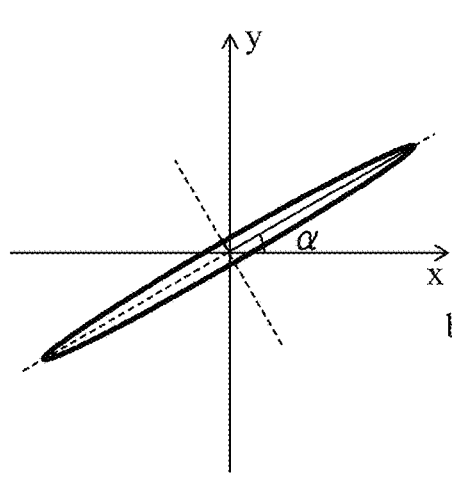
FIGS. 7A and 7B illustrate a polarization state of an object caused by an extreme luminance difference between polarization directions.
Figure 7B:
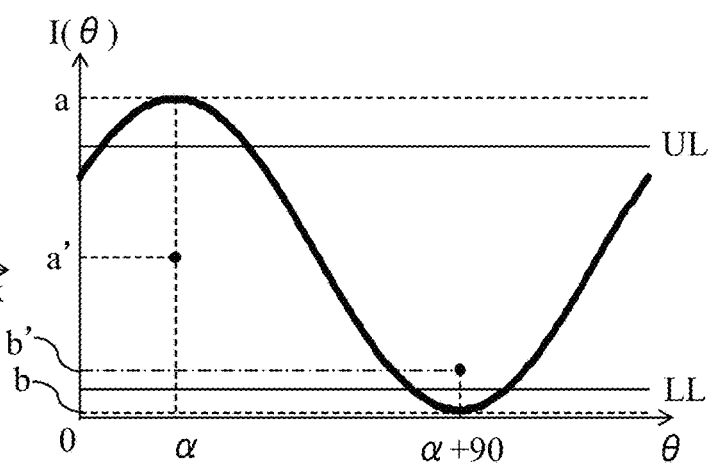

FIGS. 7A and 7B illustrate a polarization state of an object with an extreme luminance difference between polarization directions. An ellipse illustrated in FIG. 7A illustrates an azimuth dependency of an amplitude in a polarization state from an object. FIG. 7B illustrates a luminance value (light intensity) $I(\theta)$ of polarized light for an azimuth angle $\theta$ from the x-axis. In the following description, images with azimuth angle $\alpha$ and $\alpha+90°$ are captured.

An image pickup element used for a digital camera, such as a CMOS sensor and a CCD sensor, can provide a high-quality image when receiving a light quantity within a proper range that guarantees the high-quality image. When a light quantity that exceeds the upper limit enters the image pickup element, the luminance saturation occurs since photoelectrically converted electrons exceed the limit amount and the information above the upper limit is lost. This phenomenon is a state generally referred to as an "overexposure." When a light quantity that exceeds the lower limit enters the image pickup element, the SN ratio of the obtained image deteriorates because a difference becomes small between an amount of photoelectrically converted electrons and noises or electrons caused by heat etc. This phenomenon is a state generally referred to as an "underexposure" and a good image cannot be generated even with the image processing.

UL and LL in FIG. 7B represent an upper limit and a lower limit of a light quantity when the reference exposure condition is determined. As illustrated in FIG. 7B, even when a polarization component at the azimuth angle $\alpha$ is imaged, the image pickup element cannot obtain an original light quantity of the luminance value "a" but can obtain a light quantity of the upper limit UL. Even when a polarization component at the azimuth angle $\alpha+90°$ is imaged, the image pickup element cannot obtain an original light quantity of the luminance value "b" but can obtain a light quantity of the lower limit LL or a noise affected value. In this state, the polarization information cannot be correctly obtained.

Accordingly, this embodiment provides photometry in the state of an azimuth angle $\alpha$ before a polarization component is imaged at the azimuth angle $\alpha$, and sets a first exposure condition such that the obtained light quantity has a luminance value "a'." For example, when the first exposure condition is set half of exposure as high as that of the reference exposure condition, the luminance value "a" is half of the luminance value "a." In this case, the luminance value "a" can be obtained by doubling the luminance value "a'." Before the polarization component at the azimuth angle α+90° is imaged, photometry is provided in a state of the azimuth angle α+90° and a second exposure condition is set such that the object light quantity has a luminance value "b'." For example, when the second exposure condition is set to have an exposure eight times as high as that of the reference exposure condition, the luminance value "b'" is eight times as high as the luminance value "b." In this case, the luminance value "b'" is divided by eight, and thereby the luminance value "b" can be obtained.

A description will now be given of an exposure condition setting method. In this embodiment, the control unit 18 sets an exposure condition based on a photometric value so as to control an exposure amount. The exposure condition according to this embodiment includes at least one of a shutter speed (exposure time period) of an (unillustrated) shutter unit in the image pickup apparatus 100, an ISO speed of the image pickup element 2, and an F-number in the optical system 1. As the F-number in the optical system 1 is changed, a depth of field in an obtained image (an in-focus range of the object or defocus degree) changes and one combined image is discorded. Hence, in changing the exposure amount, the F-number may be made constant and at least one of the shutter speed and the ISO speed may be adjusted. When the exposure amount is changed by the shutter speed or the ISO speed, a noisy image is generated as the ISO speed is made higher and thus the exposure amount may be changed only by changing the shutter speed. Assume that f (mm) is a focal length in the optical system 1. Then, when the shutter speed is longer than a reciprocal of the focal length (1/f) (sec), an image becomes unclear due to hand vibrations and the exposure amount may be changed by adjusting the ISO speed. When the hand vibrations can be prevented with a tripod, etc., the shutter speed may be longer than 1/f (sec). Imaging each polarized light may not calculate a focal length or execute refocusing so as to maintain the depth of field of the image.

A light quantity for each pixel may be controlled by changing an amplification ratio of a signal for each pixel in the image pickup element, by controlling the sensitivity for each pixel, and by providing a modulator, such as liquid crystal, very close to the image pickup element.

As described above, this embodiment sets the exposure condition for each imaging, and can obtain precise polarization information. Hence, a high-quality image can be obtained in which a degraded image quality caused by a small light quantity, increased noises, and an overexposure caused by an excessive exposure amount is prevented.

As long as the precise polarization information is obtained, the diffuse reflection component "b" and the specular reflection component "a-b" can be calculated and thus an image at an arbitrary azimuth angle θ which is not actually captured can be generated based on the expression (2). In an expression (3), when x is set to a value larger than 1 or a negative value, a special image at an arbitrary azimuth angle θ that cannot be captured can be combined in which an effect of a specular reflection component is emphasized or weakened.

$$I(\theta)=(a-b)\times x+b \quad (3)$$

The control unit 18 or an external information processing apparatus, such as a PC, may execute a process of obtaining polarization information based on the obtained image and a process of generating an image based on the polarization information.

First Embodiment

Figure 8:
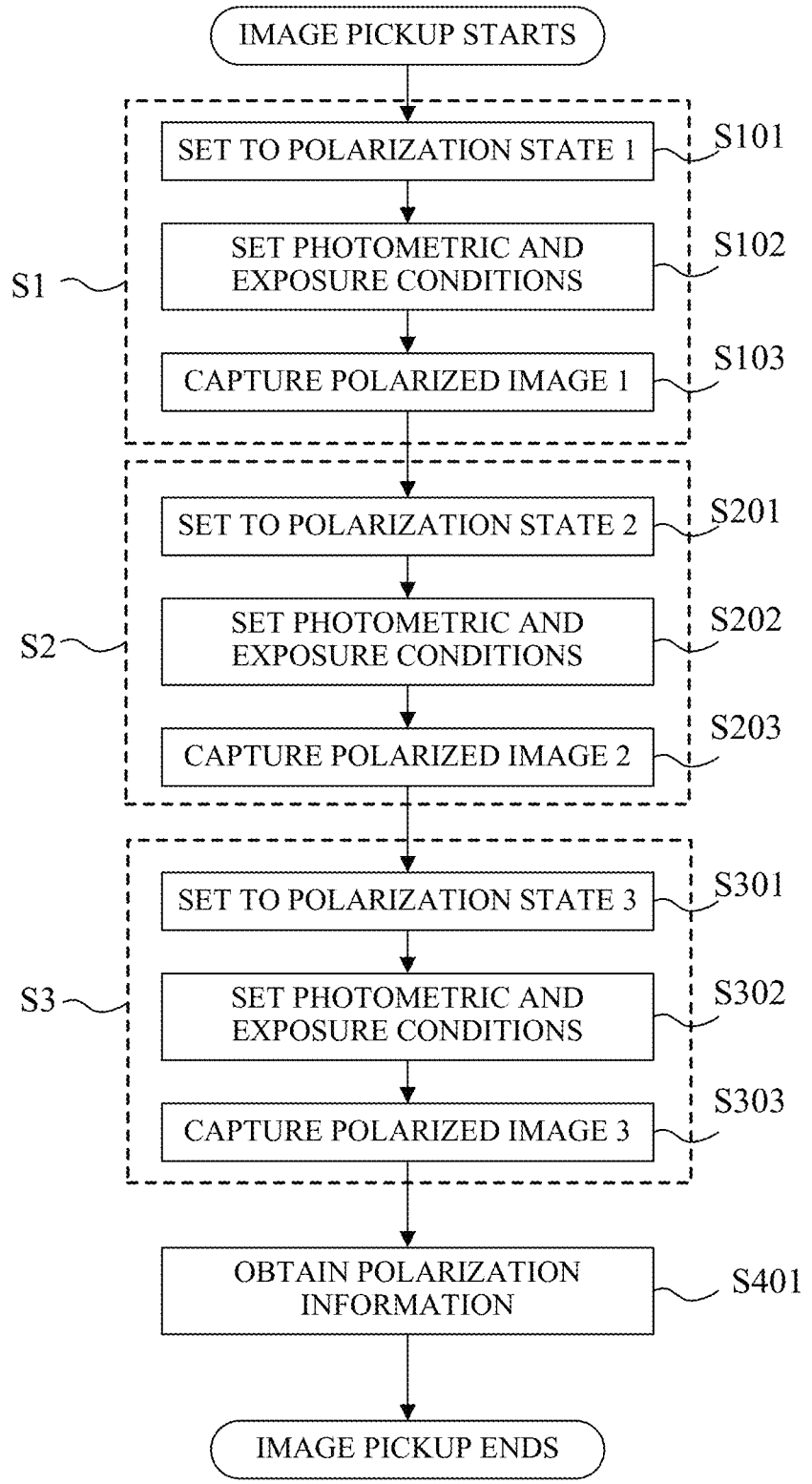
FIG. 8 is a flowchart of an image pickup control process according to a first embodiment.

Referring now to FIG. 8, a description will be given of an operation in an image pickup by the image pickup apparatus 100 so as to obtain polarization information. FIG. 8 is a flowchart of an image pickup control process (image pickup control method) according to this embodiment. A flowchart illustrated in FIG. 8 can be implemented as a program that enables a computer to execute a function of each step. The control unit executes each step in FIG. 8, but a control apparatus separate from the image pickup apparatus may execute each step in FIG. 8. The program may be installed in an unillustrated storage unit in the image pickup apparatus 100 or a device separate from the image pickup apparatus 100. The program may be recorded in a non-transitory computer-readable storage medium.

In this embodiment, a process starts when the image pickup apparatus 100 is set to a polarization imaging mode that provides an image pickup for obtaining the polarization information and a user presses an unillustrated release button on the image pickup apparatus 100 (or the control unit 18 receives a release signal). This embodiment obtains three images by capturing them while setting 0, λ/4, and λ/2 to the retardation of the variable retardation plate 4.

In the step S101, the control unit 18 sets a polarization state 1 to the polarization obtainer 7. More specifically, the polarization component controller 8 outputs to the retardation setter 6, a control signal so as to set 0 to the retardation of the variable retardation plate 4. The maximum transmission angle $\varphi_0$ is 90 degrees.

In the step S102, the control unit 18 instructs the image pickup apparatus 100 to execute the photometry, and sets the exposure condition based on the photometric value. In this embodiment, the control unit 18 makes constant the F-number of the optical system 1 and the ISO speed of the image pickup element 2, and sets each exposure condition by adjusting the shutter speed. When the shutter speed is longer than 1/f (sec) where f (mm) is the focal length of the optical system 1, the control unit 18 sets the exposure condition by adjusting the ISO speed. Even in this case, the control unit 18 sets the F-number constant. A photographer may arbitrarily set the exposure condition.

In the step S103, the control unit 18 instructs the image pickup apparatus 100 to capture an image by using the exposure condition set in the step S102, and obtains a polarized image 1. The polarized image 1 is a high-quality image having a few noises and no overexposures or underexposure because it is obtained on a proper exposure condition based on the photometric value.

In the step S201, the control unit 18 sets a polarization state 2 to the polarization obtainer 7. More specifically, the polarization component controller 8 outputs to the retardation setter 6, a control signal so as to set λ/4 to the retardation of the variable retardation plate 4. The maximum transmission angle $\varphi_0$ is 45 degrees.

In the step S202, the control unit 18 instructs the image pickup apparatus 100 to execute the photometry, and sets the exposure condition based on the photometric value. The control unit 18 may set an arbitrary exposure condition based on the photometric value. For the image alignment in the combination process, the control unit 18 makes constant the F-number and the ISO speed and sets the exposure condition set in the step S102 by adjusting the shutter speed. When the shutter speed is longer than 1/f (sec) where f (mm) is a focal length of the optical system 1, the control unit 18 sets the exposure condition by adjusting the ISO speed. Even in this case, the control unit 18 sets the F-number constant.

In the step S203, the control unit 18 instructs the image pickup apparatus 100 to capture an image by using the exposure condition set in the step S202, and obtains a polarized image 2. The polarized image 2 is a high-quality image having a few noises and no overexposure or underexposure because it is obtained on a proper exposure condition based on the photometric value.

In the step S301, the control unit 18 sets a polarization state 3 to the polarization obtainer 7. More specifically, the polarization component controller 8 outputs to the retardation setter 6, a control signal so as to set λ/2 to the retardation of the variable retardation plate 4. The maximum transmission angle $\varphi_0$ is 0 degrees.

In the step S302, the control unit 18 instructs the image pickup apparatus 100 to execute the photometry, and sets the exposure condition based on the photometric value. The control unit 18 may set an arbitrary exposure condition based on the photometric value. For the image alignment in the combination process, the control unit 18 makes constant the F-number and the ISO speed and sets the exposure condition set in the step S102 by adjusting the shutter speed. When the shutter speed is longer than 1/f (sec) where the focal length of the optical system 1 is f (mm), the control unit 18 sets the exposure condition by adjusting the ISO speed. Even in this case, the control unit 18 sets the F-number constant.

In the step S303, the control unit 18 instructs the image pickup apparatus 100 to capture an image by using the exposure condition set in the step S302, and obtains a polarized image 3. The polarized image 3 is a high-quality image having a few noises and no overexposure or underexposure because it is obtained on a proper exposure condition based on the photometric value.

In the step S401, the control unit 18 stores each polarized image obtained in each image pickup (image pickup steps S1, S2, and S3) and each polarization information correlated with each polarized image in the image recorder 9. The control unit 18 may store a series of images obtained by changing a polarization direction and correlated with the azimuth information in a lump. The control unit 18 can obtain the polarization information based on the stored polarized images, and combine a variety of images. A luminance value in combining images at different polarization directions may use a luminance value before a correction is made, such as a gamma correction.

The image pickup apparatus 100 may execute all image pickup steps through the release operation in executing the process or may obtain a polarized image through the release operation performed for each image pickup step. In other words, three polarized images may be obtained by one release operation or one polarized image may be obtained for each release operation. In still object imaging, such as landscape imaging, merchandise imaging, and still life imaging, the release operation may be made for each imaging. Alternatively, in snap imaging and motion object imaging, three polarized images may be obtained by one release operation so as to expedite the image pickup.

The control unit 18 in this embodiment sets 0, λ/4, and λ/2 to the retardation of the variable retardation plate 4, but the present invention is not limited to this embodiment. For example, this embodiment may capture images by setting other three values or by setting three or more values. The retardation of the variable retardation plate 4 used to obtain the polarized image 1 may have a retardation that prevents the voltage from being applied to the liquid crystal layer so as to minimize the driving energy (power consumption amount).

Second Embodiment

Figure 9:
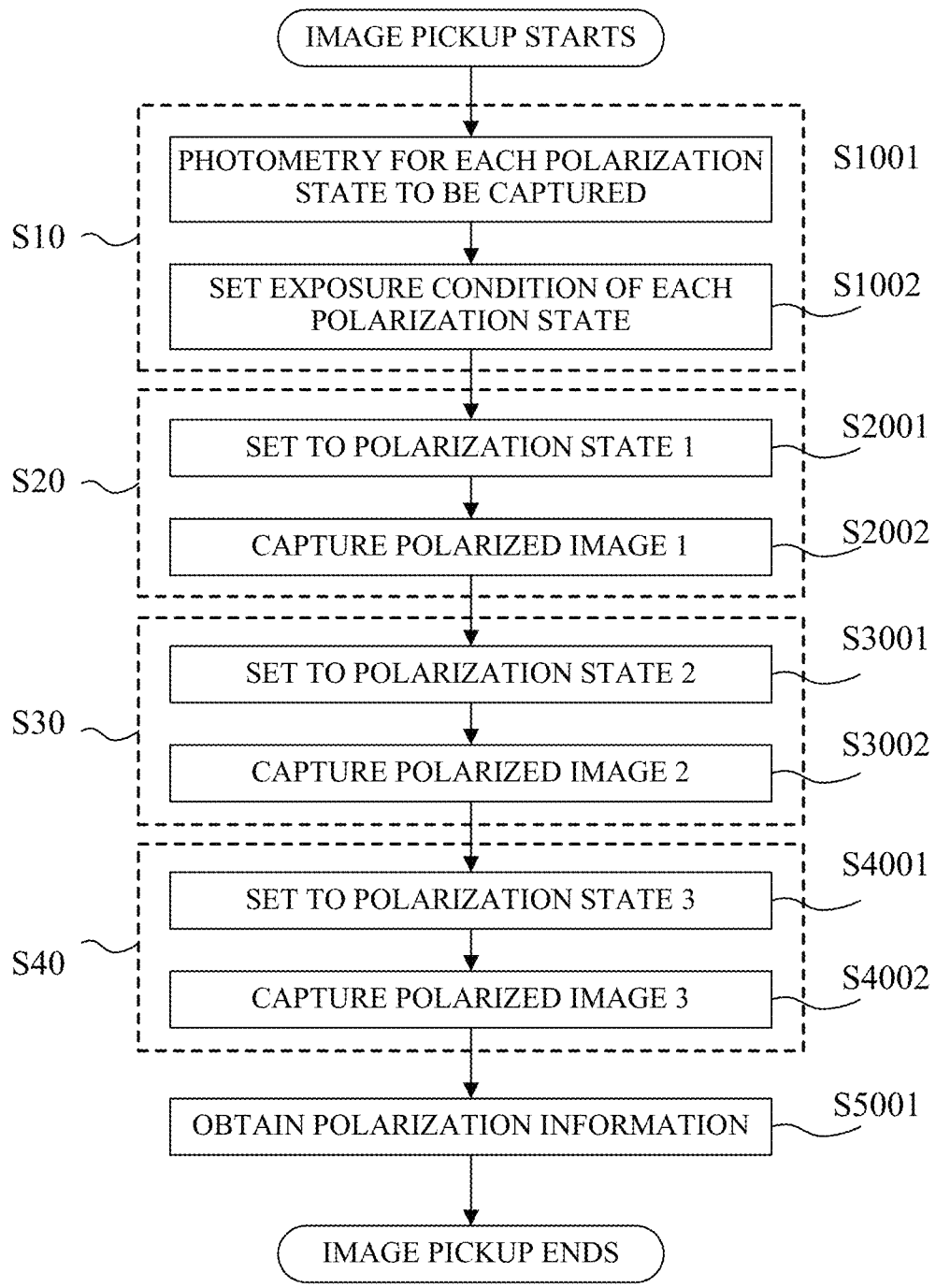
FIG. 9 is a flowchart of an image pickup control process according to a second embodiment.

Referring now to FIG. 9, a description will be given of an image pickup operation by the image pickup apparatus 100 for obtaining the polarization information. FIG. 9 is a flowchart of an image pickup control process (image pickup control method) according to this embodiment. A flowchart illustrated in FIG. 9 can be implemented as a program that enables a computer to execute a function of each step. The control unit 18 executes each step in FIG. 9, but a control apparatus separate from the image pickup apparatus may execute each step in FIG. 9. The program may be installed in an unillustrated storage unit in the image pickup apparatus 100 or a device separate from the image pickup apparatus 100. The program may be recorded in a non-transitory computer-readable storage medium.

In this embodiment, a process starts when the image pickup apparatus 100 is set to a polarization imaging mode that provides an image pickup for obtaining the polarization information and a user presses the unillustrated release button on the image pickup apparatus 100 (or the control unit 18 receives a release signal).

In the step S1001, the control unit 18 instructs the image pickup apparatus 100 to execute the photometry in at least three previously set polarization states. In this embodiment, the photometry is executed while setting states of 0, λ/4, and λ/2 (polarization states 1-3) to the retardation of the variable retardation plate 4.

In the step S1002, the control unit 18 sets the exposure condition in each polarization state. In this embodiment, for the image alignment in the combination process, the control unit 18 makes constant the F-number of the optical system 1 and the ISO speed of the image pickup element 2, and sets each exposure condition by adjusting the shutter speed. When the shutter speed is longer than 1/f (sec) where f (mm) is the focal length of the optical system 1, the exposure condition is set by adjusting the ISO speed. Even in this case, the control unit 18 sets the F-number constant. A photographer may arbitrarily set the exposure condition.

In the step S2001, the control unit 18 sets a polarization state 1 to the polarization obtainer 7. More specifically, the polarization component controller 8 outputs to the retardation setter 6, a control signal so as to set 0 to the retardation of the variable retardation plate 4. The maximum transmission angle $\varphi_0$ is 90 degrees.

In the step S2002, the control unit 18 instructs the image pickup apparatus 100 to capture an image based on the exposure condition with the polarization state 1 set in the step S2001, and obtains a polarized image 1. Even when the polarized image 1 has a biased polarization state in the object, a proper exposure condition is obtained based on the photometric value in the polarization state 1 and thus a high-quality image can be obtained with a few noises and no overexposure or underexposure.

In the step S3001, the control unit 18 sets a polarization state 2 to the polarization obtainer 7. More specifically, the polarization component controller 8 outputs to the retardation setter 6, a control signal so as to set λ/4 to the retardation of the variable retardation plate 4. The maximum transmission angle $\varphi_0$ is 45 degrees.

In the step S3002, the control unit 18 instructs the image pickup apparatus 100 to capture an image based on the exposure condition with the polarization state 2 set in the step S3001, and obtains a polarized image 2. Even when the polarized image 2 has a biased polarization state of the object, a proper exposure condition is obtained based on the photometric value in the polarization state 2 and thus a high-quality image can be obtained with a few noises and no overexposure or underexposure.

In the step S4001, the control unit 18 sets a polarization state 3 to the polarization obtainer 7. More specifically, the polarization component controller 8 outputs to the retardation setter 6, a control signal so as to set $\lambda/2$ to the retardation of the variable retardation plate 4. The maximum transmission angle $\varphi_0$ is 0 degrees.

In the step S4002, the control unit 18 instructs the image pickup apparatus 100 to capture an image based on the exposure condition with the polarization state 3 set in the step S4001, and obtains a polarized image 3. Even when the polarized image 3 has a biased polarization state of the object, a proper exposure condition is obtained based on the photometric value in the polarization state 3 and thus a high-quality image can be obtained with a few noises and no overexposure or underexposure.

In the step S5001, the control unit 18 stores each polarized image obtained in each imaging (image pickup steps S20, S30, and S40) and each polarization information correlated with each polarized image in the image recorder 9. The control unit 18 may store a series of images obtained by changing a polarization direction and correlated with the azimuth information in a lump. The control unit 18 can obtain the polarization information based on the stored polarized images, and combine a variety of images. A luminance value in combining images at different polarization directions may use a luminance value before a correction is made, such as a gamma correction.

The step S10 in this embodiment performs the photometry for each previously imaged polarization state, sets the exposure condition, and provides continuous image pickups. In other words, a photometry time period can be omitted between image pickups only by setting the retardation of the variable retardation plate 4. Due to a short time interval between image pickups of the polarization states, this embodiment is suitable for the motion object imaging.

Third Embodiment

This embodiment discusses an image pickup apparatus 200 based on the influence that occurs where an optical low-pass filter etc. is disposed. A description of a configuration common to that of the first embodiment will be omitted.

In general, an optical low-pass filter is disposed near the image pickup element so as to prevent the moiré and false color in an image pickup apparatus, such as a digital single-lens reflex camera. The polarization information of the object may not be correctly acquired even with the configuration of the first embodiment, if the optical low-pass filter is disposed in front of the image pickup element 2 or the autofocus unit in the image pickup apparatus 100 depends on the polarization. In addition, when the polarization obtainer 7 is simply disposed between the optical low-pass filter and the lens, the optical low-pass filter may not maintain the intended effect due to the influence of the polarization obtainer 7.

Figure 10:
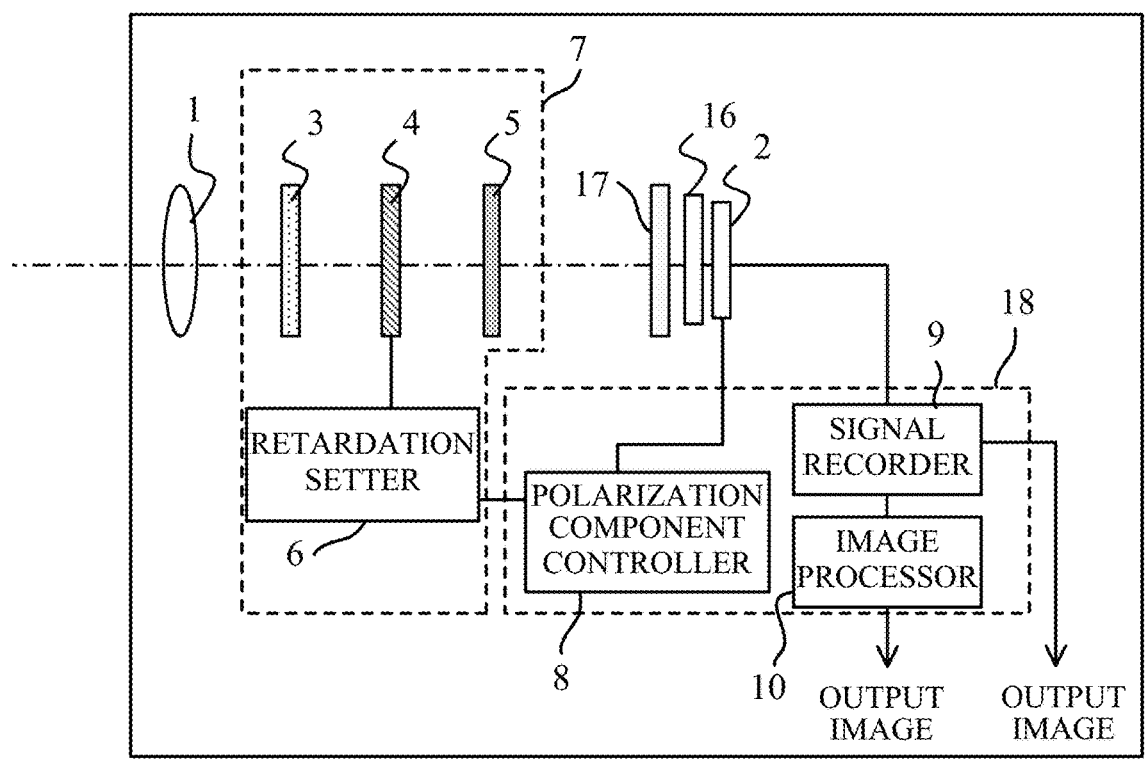
FIG. 10 illustrates a configuration of an image pickup apparatus according to a third embodiment.

FIG. 10 is a schematic diagram of the image pickup apparatus 200 including an optical low-pass filter 17. The optical low-pass filter 17 can use a component using a polarization characteristic, such as a component in which a plurality of layers made of a birefringent medium are laminated and a polarization diffraction element. As a solution for the above problem that occurs when the optical low-pass filter etc. is disposed, this embodiment inserts an achromatic quarter waveplate 16 (achromatic retardation plate, third retardation plate) into a space between the polarizer 5 and the optical low-pass filter 17 so as to convert the light into circularly polarized light. Although a usual quarter waveplate may be inserted, the quarter waveplate has a wavelength dispersion and does not provide uniformly circularly polarized light over the working wavelength range. Thus, a phase shift caused by the wavelength may appear as a color change in the image. Accordingly, a quarter wavelength plate to be inserted may be an achromatic quarter wavelength plate in which a retardation is designed to be minimum in the working wavelength range, such as a visible wavelength range. An alternative measure is to arrange a light separation direction of a layer in the optical low-pass filter 17 closest to the polarization obtainer 7 (in case of the lamination structure) and a transmitting axis direction of the polarizer 5 at 45 degrees. Even in this case, the characteristic of the optical low-pass filter and the characteristic of the polarization obtainer 7 can be reconciled. The latter measure is simpler although any one of the countermeasures can be used.

Since the working wavelength range for the general image pickup apparatus is the visible range (400 to 700 nm), $\lambda$ in the retardation of the variable retardation plate 4 may be a wavelength contained in the visible range, such as the central wavelength of 550 nm. When the working wavelength range for the image pickup apparatus is the infrared range (700 nm to 1100 nm), $\lambda$ may be a wavelength in the infrared range, such as a wavelength of 900 nm. When the working wavelength range for the image pickup apparatus contains both wavelength ranges, $\lambda$ may be a wavelength in the visible or infrared range, such as a wavelength of 750 nm.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-131638, filed Jul. 1, 2016 which is hereby incorporated by reference herein in its entirety.

What is claimed is:

1. A control apparatus comprising:
a memory configured to store instructions; and
a controller configured to execute the instructions to:
   control an image pickup apparatus, which includes an image pickup element configured to capture an image formed by an optical system, to capture a plurality of images in different polarization directions; and
   obtain polarization information based on the plurality of images,
wherein the controller is further configured to control the image pickup apparatus to capture the plurality of images under different exposure conditions while keeping an F-number of the optical system constant, and
wherein the controller is further configured to set the exposure condition by controlling an ISO speed in a case where a shutter speed is longer than a reciprocal value of a focal length of the optical system.

2. The control apparatus according to claim 1, wherein the controller is further configured to execute the instructions to:
   control the image pickup apparatus to provide a photometry for each polarization direction; and
   set the exposure condition based on a photometric value obtained from the image pickup apparatus.

3. The control apparatus according to claim 1, wherein the controller is further configured to execute the instructions to:
   control the image pickup apparatus to provide a photometry for each polarization direction;
   set the exposure condition for each polarization direction based on a photometric value obtained from the image pickup apparatus; and
   control the image pickup apparatus to obtain the plurality of images with set exposure conditions.

4. The control apparatus according to claim 1, wherein the controller is further configured to set the exposure conditions by controlling the shutter speed in a case where the shutter speed is not longer than the reciprocal value of the focal length of the optical system.

5. An image pickup apparatus comprising:
an image pickup element configured to capture an image formed by an optical system;
a controller configured to control the image pickup apparatus to capture a plurality of images in different polarization directions, and to obtain polarization information based on the plurality of images;
a first retardation plate configured to provide a retardation of $\pi/2$ between a polarization component in a slow axis direction and a polarization component in a fast axis direction;
a second retardation plate configured to change a retardation provided between a polarization component in a slow axis direction and a polarization component in a fast axis direction;
a polarizer configured to extract a polarization component to be introduced to the image pickup element; and
a setter configured to set the retardation of the second retardation plate according to the polarization component of light from the object to be introduced to the image pickup element,
wherein the controller is further configured to control the image pickup apparatus to capture the plurality of images under different exposure conditions while keeping an F-number of the optical system constant,
wherein the first retardation plate, the second retardation plate, and the polarizer are arranged in this order from a side of an object to a side of the image pickup element, and
wherein the slow axis direction of the second retardation plate tilts to both the slow axis direction and the fast axis direction of the first retardation plate.

6. The image pickup apparatus according to claim 5, further comprising the optical system.

7. The image pickup apparatus according to claim 5, wherein the second retardation plate includes a liquid crystal layer, and
wherein the setter is configured to control the retardation of the second retardation plate by changing an applied voltage to the liquid crystal layer.

8. A control method comprising the steps of:
controlling an image pickup apparatus, which includes an image pickup element configured to capture a plurality of images via an optical system in different polarization directions; and
obtaining polarization information based on the plurality of images,
wherein the step of controlling includes:
   setting different exposure conditions by controlling an ISO speed in a case where a shutter speed is longer than a reciprocal value of a focal length of the optical system; and
   controlling the image pickup apparatus to capture the plurality of images under the different exposure conditions while keeping an F-number of the optical system constant.

9. The control method according to claim 8, further comprising the step of obtaining a photometric value by controlling the image pickup apparatus to provide a photometry for each polarization direction,
wherein the exposure condition is set based on the photometric value.

10. The control method according to claim 8, wherein the exposure condition is set for each polarization direction based on each photometric value obtained by controlling the image pickup apparatus to provide a photometry for each polarization direction before the image pickup apparatus obtains the image.

11. The control method according to claim 8, wherein the exposure condition is set by controlling the shutter speed in a case where the shutter speed is not longer than the reciprocal value of the focal length of the optical system.

12. An image pickup apparatus comprising:
an image pickup element configured to capture an image formed by an optical system; and
the control apparatus according to claim 1.

* * * * *